US012099006B1

(12) United States Patent
Bulcha

(10) Patent No.: US 12,099,006 B1
(45) Date of Patent: Sep. 24, 2024

(54) WIDEBAND SUBHARMONIC MIXER

(71) Applicant: United States of America as represented by the Administrator of NASA, Washington, DC (US)

(72) Inventor: Berhanu Bulcha, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 84 days.

(21) Appl. No.: 17/894,534

(22) Filed: Aug. 24, 2022

(51) Int. Cl.
*G01N 21/3581* (2014.01)
*H03D 7/12* (2006.01)

(52) U.S. Cl.
CPC .......... *G01N 21/3581* (2013.01); *H03D 7/12* (2013.01)

(58) Field of Classification Search
None
See application file for complete search history.

(56) References Cited

U.S. PATENT DOCUMENTS

| | | | | |
|---|---|---|---|---|
| 4,485,488 A * | 11/1984 | Houdart | ............... | H03D 7/1408 455/330 |
| 6,725,029 B1 * | 4/2004 | Allen | .................. | H03D 9/0608 455/302 |
| 7,167,698 B2 * | 1/2007 | Katz | ........................ | H04B 1/30 455/333 |
| 7,450,051 B1 * | 11/2008 | Valentine | ............. | H03D 7/1408 342/115 |
| 7,860,473 B2 * | 12/2010 | Hardacker | .......... | H04W 52/246 455/249.1 |
| 7,933,576 B2 * | 4/2011 | Ji | ........................ | H03D 7/1425 455/326 |
| 8,115,673 B1 * | 2/2012 | McEwan | ................. | G01S 7/288 342/197 |
| 8,559,905 B2 * | 10/2013 | Buer | ........................ | H03D 7/02 455/114.1 |
| 8,693,973 B2 * | 4/2014 | Chattopadhyay | .... | H03D 9/0633 455/313 |
| 8,748,822 B1 * | 6/2014 | Gerecht | ............ | G01N 21/3586 250/339.07 |
| 9,059,794 B2 * | 6/2015 | Diez | ..................... | H04B 17/345 |
| 9,470,779 B2 * | 10/2016 | Stokes | ..................... | G01S 15/14 |
| 9,921,170 B2 * | 3/2018 | Pate | ........................ | G01J 3/453 |
| 10,868,497 B2 * | 12/2020 | Wang | ..................... | H03B 19/05 |
| 11,038,493 B1 * | 6/2021 | Lakdawala | ............ | H03B 19/12 |
| 11,316,475 B1 * | 4/2022 | Ku | ........................ | H03D 7/1408 |
| 11,448,593 B1 * | 9/2022 | Ensher | ..................... | G01J 3/10 |
| 2003/0156658 A1 * | 8/2003 | Dartois | ................. | H03F 1/3247 375/297 |
| 2006/0152290 A1 * | 7/2006 | Lee | ........................ | H03L 7/113 331/16 |

(Continued)

FOREIGN PATENT DOCUMENTS

| | | | | |
|---|---|---|---|---|
| GB | 2561205 A | * 10/2018 | ............... | H03D 7/02 |
| WO | WO-2009073358 A1 | * 6/2009 | ............... | H03D 7/02 |

*Primary Examiner* — David P Porta
*Assistant Examiner* — Djura Malevic
(74) *Attorney, Agent, or Firm* — Christopher O. Edwards; Matthew F. Johnston; Trenton J. Roche

(57) ABSTRACT

A heterodyne-based submillimeter-wave spectrometer includes a frequency mixer that combine a local oscillator (LO) signal and a radio frequency (RF) signal to translate from a high frequency to a lower frequency or an intermediate frequency (IF) signal.

17 Claims, 7 Drawing Sheets

(56) References Cited

U.S. PATENT DOCUMENTS

| | | | |
|---|---|---|---|
| 2006/0239384 A1* | 10/2006 | Le Naour | H03D 7/163 375/327 |
| 2008/0032659 A1* | 2/2008 | Chang | H03D 7/1475 455/323 |
| 2008/0132194 A1* | 6/2008 | Ji | H03D 7/1441 455/326 |
| 2008/0169859 A1* | 7/2008 | Garcia | H03D 7/1491 327/355 |
| 2009/0028216 A1* | 1/2009 | Gresham | H04B 1/7174 375/130 |
| 2009/0039943 A1* | 2/2009 | Kim | H03D 7/1441 327/361 |
| 2009/0203345 A1* | 8/2009 | Sorrells | H03D 7/1441 455/313 |
| 2010/0298709 A1* | 11/2010 | Needles | G01S 15/8956 600/458 |
| 2012/0280742 A1* | 11/2012 | Chattopadhyay | H03D 7/02 257/E21.359 |
| 2013/0045696 A1* | 2/2013 | Skafidas | H03D 7/165 455/256 |
| 2013/0202020 A1* | 8/2013 | Diez | H04B 17/0085 455/115.2 |
| 2014/0286131 A1* | 9/2014 | Stokes | G01S 7/526 367/87 |
| 2016/0131600 A1* | 5/2016 | Pate | G01N 22/00 250/339.08 |
| 2016/0228006 A1* | 8/2016 | Zimmermann | A61B 6/025 |
| 2017/0138847 A1* | 5/2017 | Pate | G01J 3/42 |
| 2017/0184719 A1* | 6/2017 | Stokes | G01S 7/526 |
| 2017/0237399 A1* | 8/2017 | Convert | H03D 7/02 327/355 |
| 2020/0284716 A1* | 9/2020 | Kovacs | G01N 21/62 |
| 2022/0337292 A1* | 10/2022 | Jain | H04B 7/0413 |
| 2023/0089039 A1* | 3/2023 | Hartin | H01S 5/0602 250/503.1 |

* cited by examiner

200

400

500

WIDEBAND SUBHARMONIC MIXER

STATEMENT OF FEDERAL RIGHTS

The invention described herein was made by employees of the United States Government and may be manufactured and used by or for the Government for Government purposes without the payment of any royalties thereon or therefore.

FIELD

The present invention relates to a wideband subharmonic mixer for lunar applications.

BACKGROUND

Current technology mixers demonstrated a downconversion process; however, the intermediate frequency (IF) bandwidth is limited to around 20 GHz. This means to cover broadband signals up to 70 GHz for simultaneous detection, more than one mixer is required to cover a section of the frequency band, which increases the instrument's complexity, mass, and size.

Therefore, an improved wideband subharmonic mixer for lunar application.

SUMMARY

Certain embodiments of the present invention may provide solutions to the problems and needs in the art that have not yet been fully identified, appreciated, or solved by current antenna technologies. For example, some embodiments of the present invention pertain to a wideband subharmonic mixer for lunar application. More specifically, some embodiments provide a novel circuit design of a heterodyne mixer that allows a 470-620 GHz radio frequency (RF) signal and downconvert to an ultra-broadband 0-70 GHz IF signal.

In an embodiment, a heterodyne-based submillimeter-wave spectrometer includes a frequency mixer that combine a local oscillator (LO) signal and a radio frequency (RF) signal to translate from a high frequency to a lower frequency or an intermediate frequency (IF) signal.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

The heterodyne-based submillimeter-wave spectrometer (hereinafter referred to as "spectrometer") is a powerful remote sensing tool for exploring the volatile in gas giants, Earth, terrestrial planets, comets, satellite plumes, and asteroid exospheres. The spectrometer combines a signal from local oscillator (LO) with a radio frequency (RF) using a critical mixer component (i.e., the targeted molecular spectral line) to translate to a much lower frequency, known as intermediate frequency (IF). The down-converted broadband IF signal is digitized to uncover the spectral response of the targeted molecular spectral lines. Some embodiments use a mixer with a wide IF bandwidth (e.g., >70 GHz) to detect fourteen molecular species simultaneously in the 530-600 GHz frequency range. The mixer may be scaled and adjusted to modify its center frequency and bandwidth from 1 GHz to above 1 THz for applications such as astronomy, military, and broadband communication systems.

In some embodiments, the mixer allows for simultaneous detection of several molecular species with its broadband IF of 70 GHz such as $H_2O$, HDO, $SO_2$, CO, $H_2S$, $H_2O_2$, $O_3$, and $NH_3$. This mixer has a significant advantage over current technologies that are available on the market, which have an IF bandwidth being less than 20 GHz. With a low IF bandwidth, the spectral window of simultaneous observations is limited, and to cover the remaining spectral lines, additional receivers are required. The additional of receives increase the size, weight, and power (SWaP) of the instrument payload. For this reason, some embodiments may provide a compact, sensitive, and broadband solution for numerous applications in astronomy, the military, and broadband communication.

Figure 1:
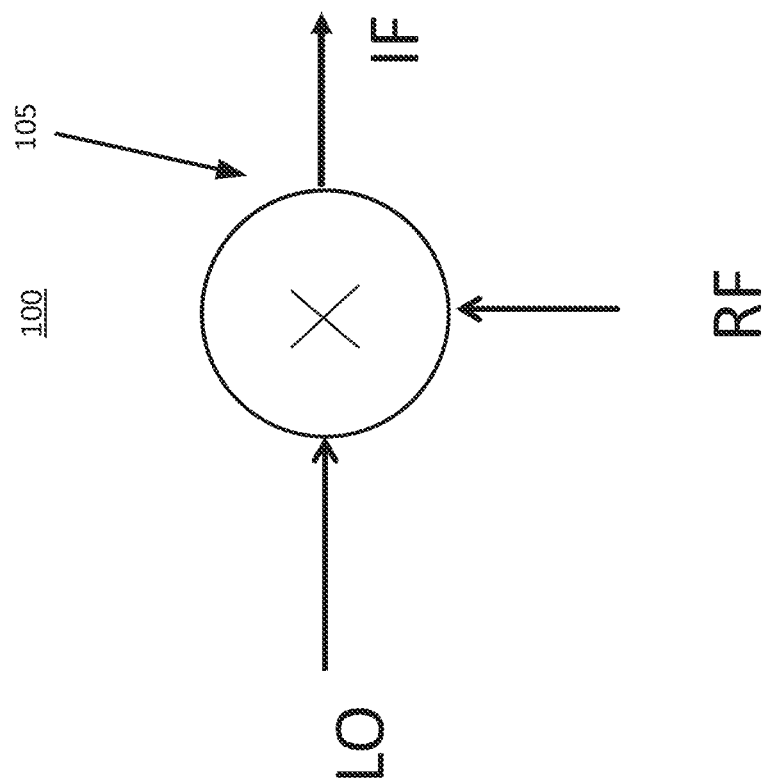
FIG. 1 is a graph illustrating a heterodyne receiver downconversion of RF to intermediate frequency (IF), according to an embodiment of the present invention.

FIG. 1 is a circuit diagram illustrating a microwave heterodyne receiver topology 100, according to an embodiment of the present invention. In this embodiment, FIG. 1 illustrates two mixing frequencies (i.e., LO and RF) using a non-linear component 105 known as a frequency mixer to produce a unique frequency (i.e., IF).

Figure 2:
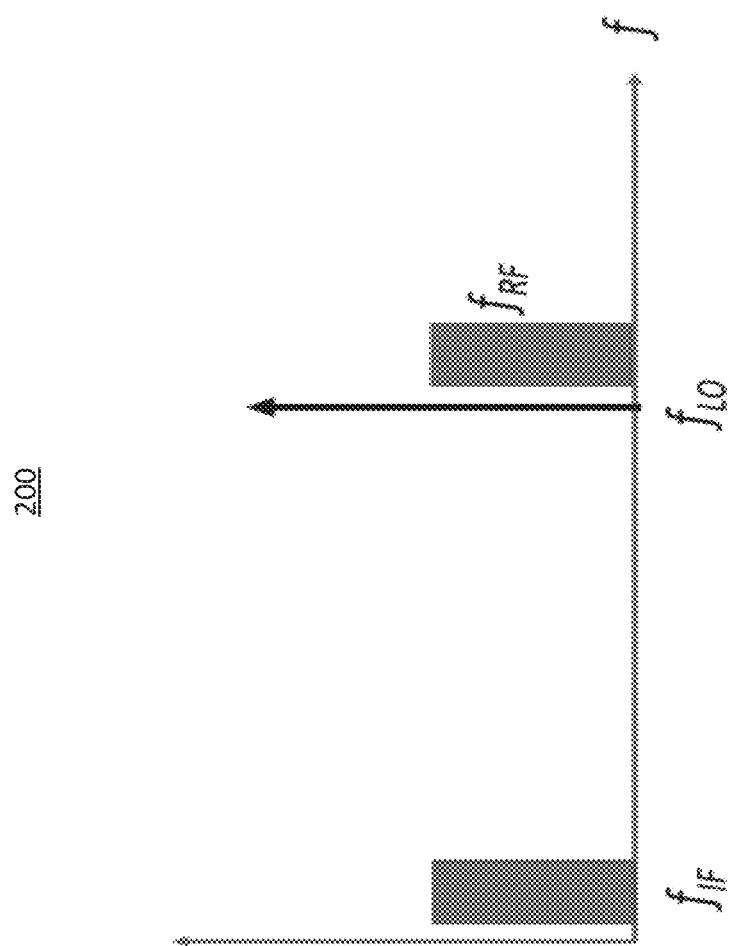
FIG. 2 is a diagram illustrating a wideband sub-harmonic mixer, according to an embodiment of the present invention.

FIG. 2 is a graph 200 illustrating a heterodyne receiver frequency channels and down conversion process, according to an embodiment of the present invention. In particular, graph 100 shows a representative frequency spectrum of a single tone of LO frequency and broadband of RF signal mixing using a non-linear component to produce a lower frequency (i.e., IF frequency) represented in the spectrum.

Mixer Configuration

Figure 3A:
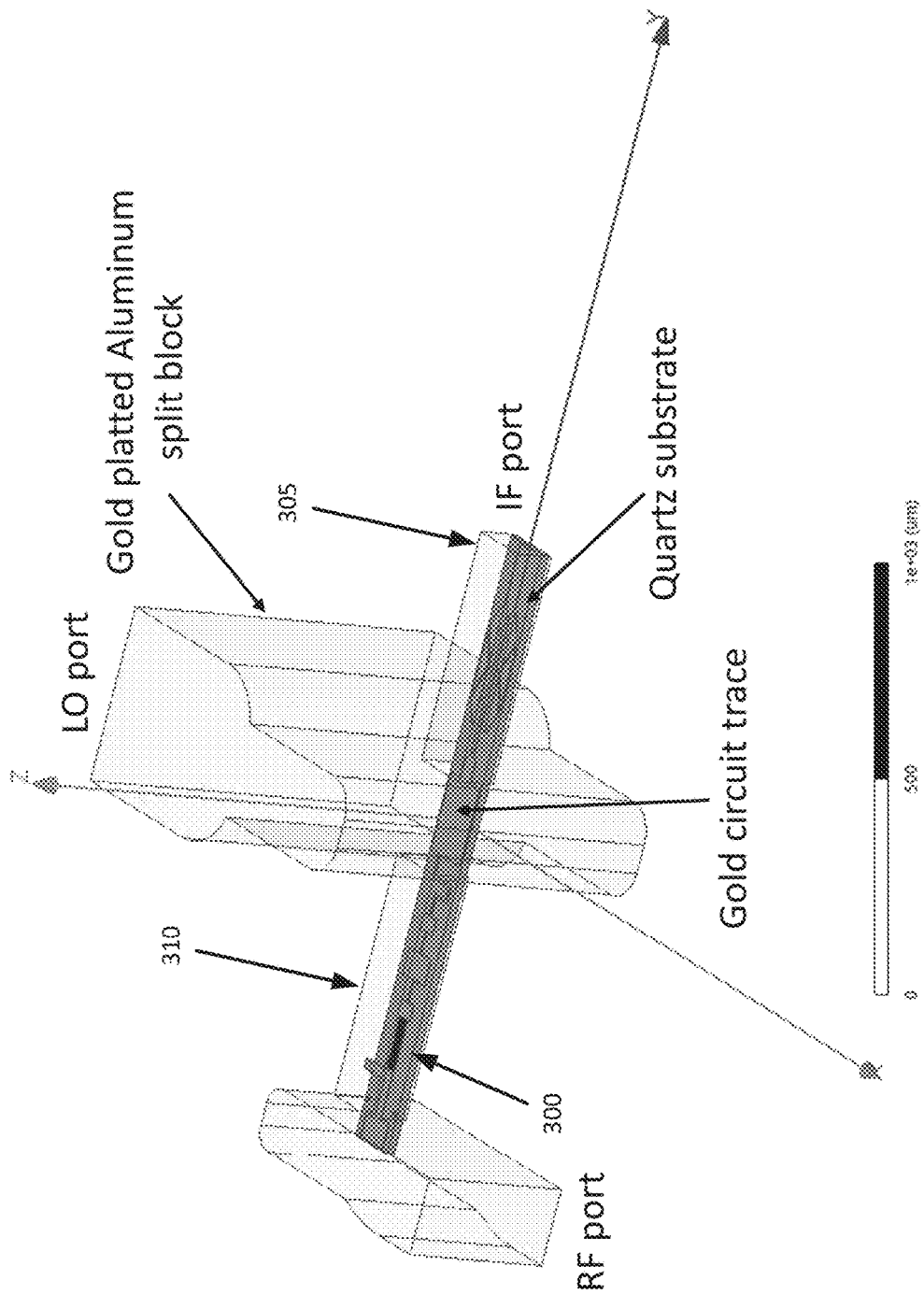
FIG. 3A is a diagram of a subharmonic mixer on waveguide channels, according to an embodiment of the present invention.
Figure 3B:
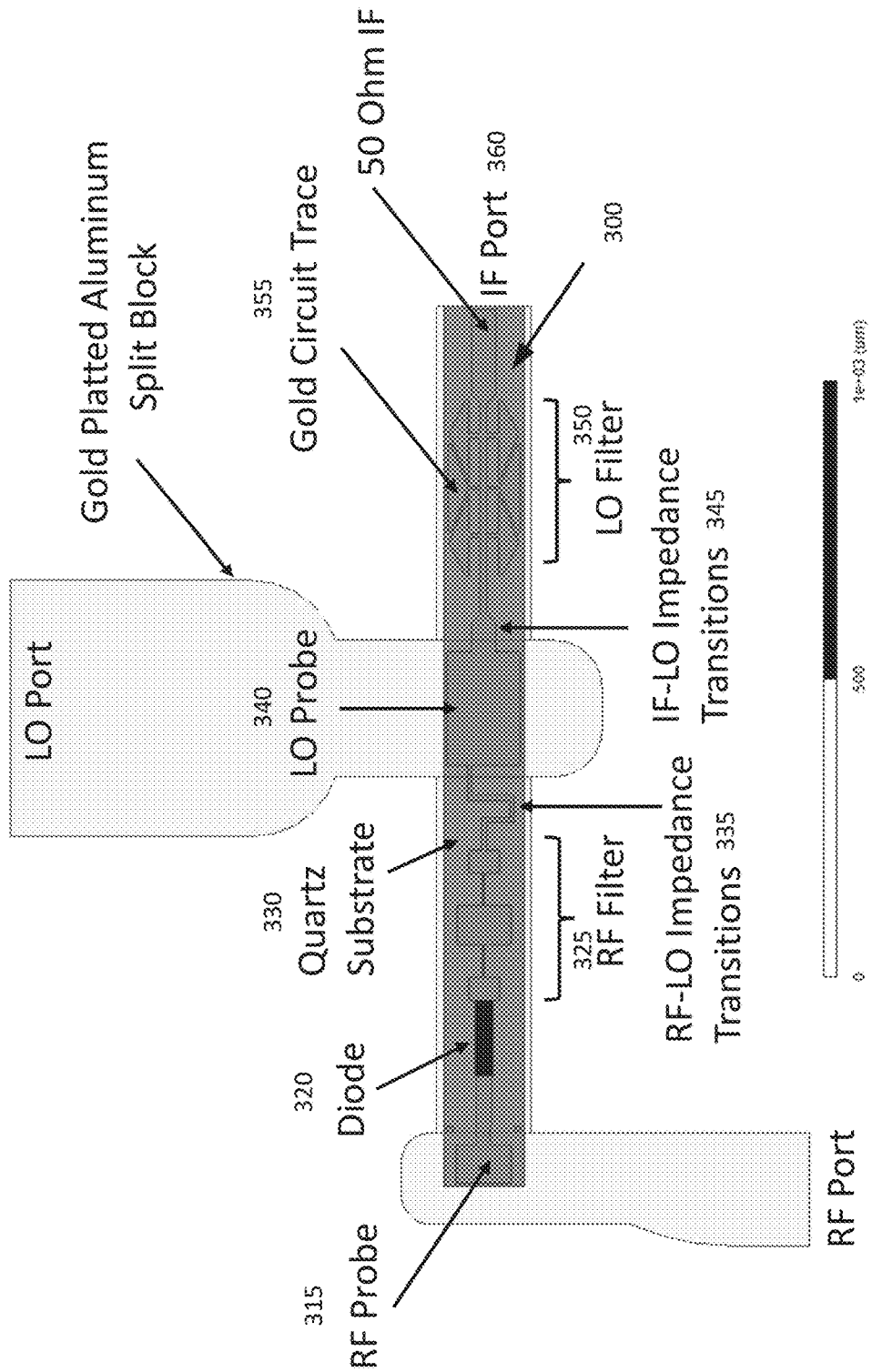
FIG. 3B is a second diagram of a subharmonic mixer on waveguide channels, according to an embodiment of the present invention.
Figure 3C:
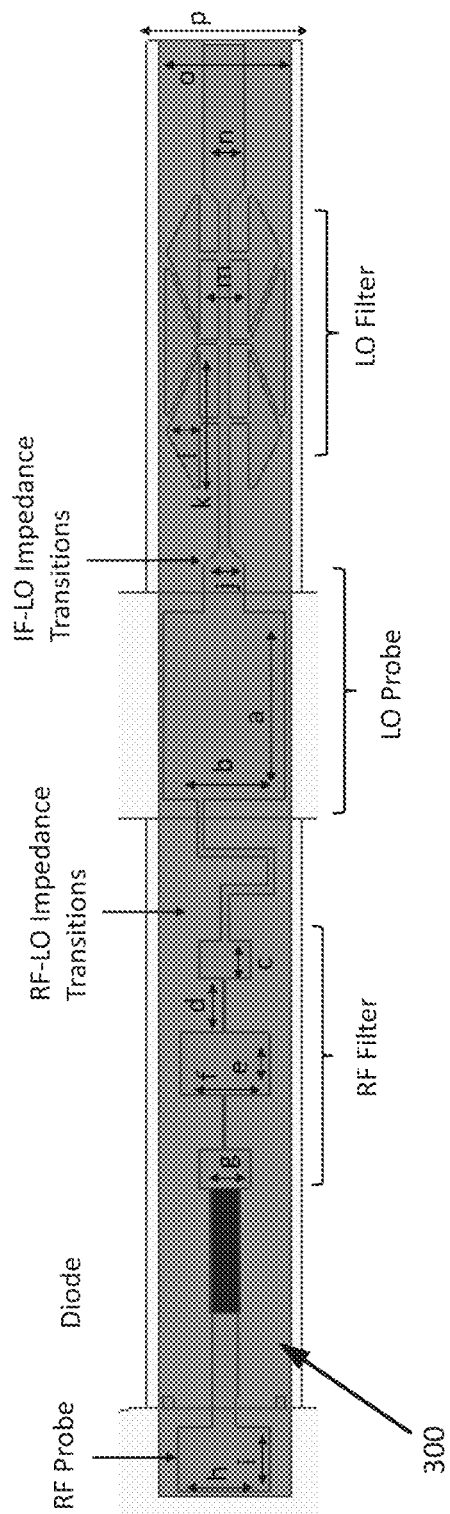
FIG. 3C is a third diagram of a subharmonic mixer on waveguide channels, according to an embodiment of the present invention.

FIGS. 3A-C are diagrams illustrating a wideband sub-harmonic mixer (hereinafter referred to as the "mixer") 300, according to an embodiment of the present invention. More specifically, FIG. 3A shows a prospective view and FIG. 3B shows a top view of mixer 300. In some embodiments, mixer 300 operates between 530 GHz band and 600 GHz band.

To couple the E-M wave to mixer 300, mixer 300 includes a WR-3.4 LO waveguide 305 and LO probe 310, which allows for a 265-300 GHz input signal. In addition, mixer 300 includes an RF WR-1.5 band waveguide 310 and RF probe 320 for 530-600 GHz operations.

In certain embodiments, mixer 300 allows the LO and RF signal to mix and down-convert the RF signal to an IF, which is at a much lower frequency for further digitization process. For example, when a 530-540 GHz RF signal mixes with a 530 GHz single tone LO source, mixer 300 produces an IF signal that is 0-10 GHz range.

Diode 320 is a non-linear component that uses subharmonic frequency, and produces harmonics of an input signal (f) with a factor of 2*N. The factor, N, is an integer (1, 2, 3 . . . . N). For example, for an input frequency of 300 GHz, diode 320 produces 600 GHz, 1200 GHz, i.e., 2*N*300 GHz. Mixer 300 may down-convert the RF signal (e.g., 530-600 GHz) at the nonlinear diode 0.1 MHz to 70 GHz IF signal. IF port 360 of mixer 300 may use a 1 mm connector that permits a signal >70 GHz.

In some embodiments, mixer 300 is implemented on Quartz substrate 330. Depending on the embodiment, Quartz substrate 330, which has an inherent material property, provides a lower dielectric constant (e.g., Er=4). Depending on the embodiment, Quartz substrate 330 uses a substrate thickness of 20 µm. Depending on the width of gold circuit trace 355, the thickness of Quartz substrate 330 allows for achieving the appropriate impedance to match it with diode 320 impedance and provide a broadband mixer design.

The conductor layer of mixer 300 contains a 0.5 µm gold metal (e.g., gold circuit trace 355), which is deposited on Quartz substrate 330.

For a single waveguide mode excitation in the frequency band, a substrate width of 153.5 µm and 183.5×91.5 µm channel dimensions may be used. In some embodiments, a high-frequency structure simulator (HFSS) may be used to design and optimize the structure.

To increase the compactness and bandwidth of mixer 300, LO filter 350 using a triangular patch resonator-based low-pass filter (LPF) is implemented. LO filter 350 may provide isolation between an input LO signal and the wide IF signal. To further reduce the dimensions of mixer 300 for multi-pixel applications, an LO filter 350, RF filter 325, Schottky diode 320, LO probe 340, and RF probe 315 are integrated into one chip with final dimensions of 136 µm×1.435 mm, in this embodiment.

In certain embodiments, waveguide channels 300 include WM-380 standard RF waveguide with dimensions of a=380 µm and b=190 µm, and a standard LO waveguide WM-864 with dimensions of a=864 µm and b=432 µm.

Once the signal propagates through the RF waveguide 310, it couples to RF probe 315 with dimensions of 65×95 µm, and the signal is terminated at nonlinear diode 320. Behind diode 320, a three-stage high-impedance and low-impedance filter 350 is implemented to terminate the RF signal. Filter 350 prevents a RF leak to other ports and maintains high efficiency, and improves device sensitivity.

Similarly, LO signal propagates through the LO waveguide 305 and couples into the circuit using LO probe 310 with dimensions of 126×190 µm. To block LO signal leakage to IF port 360, an LO filter 340 that has a sharp stop band is implemented. LO filter 340 contains a triangular patch resonator-based six-pole structures, in some embodiments. The six triangular filter configuration includes a 38 µm high and 140 µm base.

RF filter 325 allows the LO signal to couple to diode 320 without attenuation. An IF-LO impedance transition 345 is applied to match the LO filter's 350 impedance to RF probe 315, and reduce reflection and power loss. Similarly, a quarter-wave RF-LO impedance transition 335 with 4 µm wide is used between LO probe 340 and RF filter 325 to impedance match and to reduce losses and reflection of the LO signal propagating to nonlinear diode 320.

Figure 4:
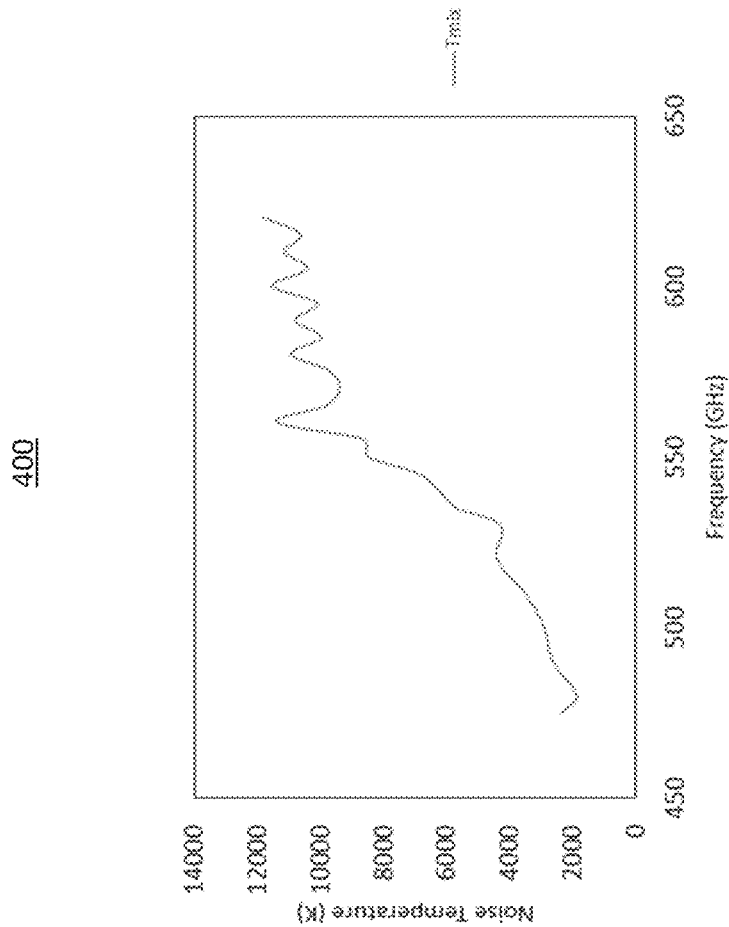
FIG. 4 is a graph illustrating a mixer noise temperature performance, according to an embodiment of the present invention.

FIG. 4 is a graph 400 illustrating a mixer noise temperature performance according to an embodiment of the present invention. Graph 400 illustrates an RF frequency on the x-axis versus the mixer noise temperature performance displayed on the y-axis.

Figure 5:
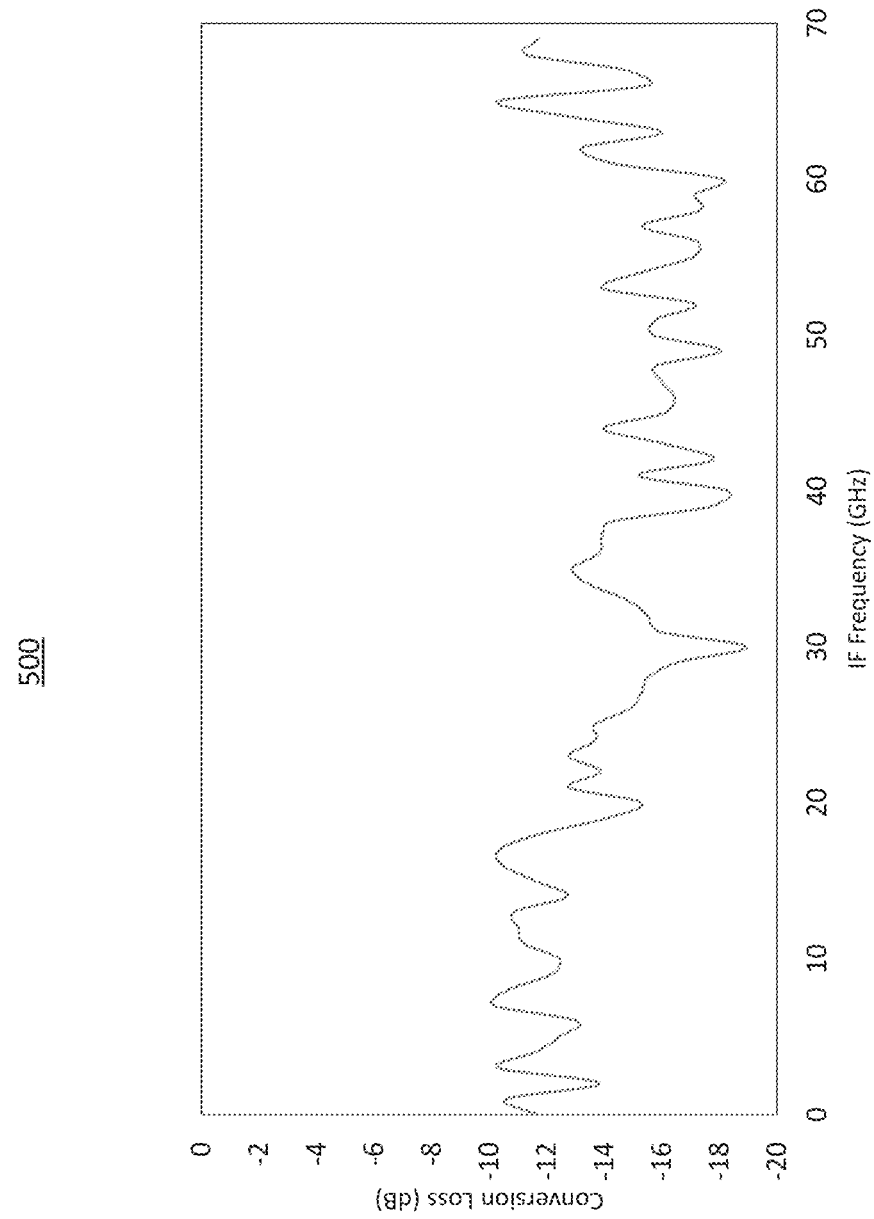
FIG. 5 is a graph 500 illustrating IF broadband mixer performance, according to an embodiment of the present invention.

FIG. 5 is a graph 500 illustrating IF broadband mixer performance, according to an embodiment of the present invention. Graph 500 illustrates the downconverted broadband IF signal represented on the x-axis and the mixer performance noise temperature on the y-axis.

Filter Fabrication and Assembly

To fabricate the mixer circuits, a photomask was created, and gold was deposited on the thin Quartz substrate. Once the fabrication is completed, the individual chips were deiced and singulated. To provide a waveguide interface to test the circuits, a metallic E-plane split blocks with the appropriate channels to mount the filter circuits were designed and machined using Computer Numerical Control (CNC) tools. To reduce the metallic loss, the aluminum block is gold coated. The mixer circuits are then carefully assembled into the metallic channels with the aid of alignment keys that are included in the mixer design and the circuit is secured using conductive silver epoxy.

Mixer Characterization

The mixer is characterized using a Y-factor hot/cold method, commonly used to characterize the mixer's equivalent noise temperature. To remove the IF amplifier-filter chain noise contribution, the chain was characterized, and a spurious free 500 MHz was allocated. Hot/Cold measurement was performed, and the noise temperature ~500 K is reported.

Following the initial characterization, the mixer was pumped by an LO Amplifier Multiplier Chain (AMC) with WM864 waveguide, providing a 2-5 mW microwave power in the 470 to 630 GHz. The AMC was connected to the mixer LO port and pumping the mixer, a hot load and cold load (liquid nitrogen) with a 20 Hz chopper spinning, the RF input was ejected, and the equivalent noise temperature was measured. FIG. 5 shows the noise temperature performance of the mixer circuit in the 470-630 GHz range, and at 500 GHz, the noise temperature is <2,000 K, which is state-of-the-art performance.

To characterize the IF bandwidth, a WM-380 frequency extender with Vector Network Analyzer (VNA) was used as an RF source. The RF output power was measured using Ericson absolute Power Meter, and a −27 dB to −30 dB is recorded in the 520 GHz to 590 GHz frequency range. In this test, LO frequency was fixed at 520 GHz, the RF frequency was to swept to cover 70 GHz IF bandwidth, and the IF output was measured with Spectrum Analyzer and compared to calculate the mixer broadband conversion loss.

Referring now to FIG. 3C as an example, the mixer design annotated with a number of dimension parameters is used for scaling 300 for operational center frequencies ranging from 1-1000 GHz.

Referring now simultaneously to FIGS. 3B and 3C as an example only, the dimensional parameters used for scaling 300 may be as follows:

the length of LO probe 340 is a
the width of LO probe 340 is b
the length of RF filter is c the width of RF filter is g
the length of high impedance RF filter is d
the length of low impedance RF filter is e
the width of low impedance RF filter f
the width of RF probe is h
the length of RF probe is I
the width of IF-LO impedance transition is j
the base width of LO filter triangle is k
the height of LO filter triangle is l
the gap between the two opposite triangles is m
the width of the microstrip to the IF is n
the width of the substrate is o
the width of the metallic waveguide channel is p The following list of the above-referenced parameters includes a value for each parameter in (micrometers*GHz), where each value has been normalized for an operational center frequency of 1 GHz. That is, for any other operational center frequency between 1 GHz and 1000 GHz, each of the values is simply scaled or multiplied by the reciprocal of the factor used to increase the operational center frequency to obtain dimension values in micrometers. For example, each of the values is multiplied by $\frac{1}{500}$ for an operational center frequency of 500 GHz, etc.

a=95000 micrometers
b=63000 micrometers
c=19250 micrometers
d=27500 micrometers
e=25000 micrometers
f=45000 micrometers
g=33500 micrometers
h=475000 micrometers
i=31000 micrometers
j=20500 micrometers
k=70000 micrometers
l=9000 micrometers
m=2500 micrometers
n=22500 micrometers
o=68000 micrometers
p=78000 micrometers The described mixer design may be built on a variety of substrate material by conserving the impedance of the the microstrip lines. For example, the width of the microstrip to the IF, i.e., n could be used as a reference to conserve a 50 ohms impedance when altering the circuit substrate to other materials.

It will be readily understood that the components of various embodiments of the present invention, as generally described and illustrated in the figures herein, may be arranged and designed in a wide variety of different configurations with variations on the materials indicated. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skilled in the art that certain modifications, variations, and alternative constructions would be apparent, while remaining within the spirit and scope of the invention. In order to determine the metes and bounds of the invention, therefore, reference should be made to the appended claims.

The invention claimed is:

1. A heterodyne-based submillimeter-wave spectrometer, comprising:
   a frequency mixer configured to combine a local oscillator (LO) signal and a radio frequency (RF) signal to translate from a high frequency to a lower frequency to form an intermediate frequency (IF) signal, the frequency mixer comprising,
   an RF probe configured to receive the RF signal;
   an LO probe configured to receive the LO signal;
   an IF port configured to output the IF signal;
   a nonlinear diode configured to terminate the RF signal and configured to couple the LO signal;
   an RF filter disposed between the nonlinear diode and the LO probe configured to terminate the RF signal and prevent attenuation of the LO signal;
   an LO filter disposed between the LO probe and the IF port configured to block LO signal leakage;
   an RF-LO impedance transition disposed between the RF filter and the LO probe;
   an IF-LO impedance transition disposed between the LO probe and the IF port.

2. The spectrometer of claim 1, wherein the RF signal is between a 470 and 620 GHz and the lower frequency or the IF signal is between 0 and 70 GHz.

3. The spectrometer of claim 1, wherein the frequency mixer comprises a LO waveguide and wherein the LO probe is configured to receive an input signal between 265 and 300 GHz.

4. The spectrometer of claim 1, wherein the frequency mixer comprises a RF waveguide band and wherein the RF probe is configured to receive an input signal between 470 and 620 GHz.

5. The spectrometer of claim 1, wherein the frequency mixer is configured to multiply and down-convert the LO signal and RF signal to produce the IF signal ranging between 0 and 70 GHz.

6. The spectrometer of claim 1, wherein the frequency mixer is situated on a Quartz substrate providing a low dielectric constant, wherein the low dielectric constant is Er=4.

7. The spectrometer of claim 1, wherein the LO filter uses a triangular patch resonator-based low-pass filter (LPF) to isolate between the LO signal and the IF signal.

8. The spectrometer of claim 1, wherein the IF-LO impedance transition is configured to match an impedance of the LO filter to an impedance of the RF probe.

9. The spectrometer of claim 1, wherein the RF-LO impedance transition is a quarter-wave RF-LO impedance transition configured to impedance match and reduce losses and reflection of the LO signal propagating to the nonlinear diode.

10. The spectrometer of claim 1, wherein the RF filter includes a three-stage filter having a high impedance filter, a low impedance filter, and a third stage filter.

11. A heterodyne-based submillimeter-wave spectrometer, comprising:
a frequency mixer configured to combine a local oscillator (LO) signal and a radio frequency (RF) signal to translate from a high frequency to a lower frequency or an intermediate frequency (IF) signal, wherein the frequency mixer includes a three-stage RF filter and a LO filter to reduce signal leakage to an IF signal port,
wherein the three-stage RF filter includes a high impedance filter, a low impedance filter, and a third stage filter,
wherein the LO filter includes a plurality of triangular patch resonator-based six-pole structures, and
wherein the RF signal is between a 470 and 620 GHz and the lower frequency or the IF signal is between 0 and 70 GHz.

12. The spectrometer of claim 11, wherein the frequency mixer comprises a LO waveguide and a LO probe configured to receive an input signal between 265 and 300 GHz.

13. The spectrometer of claim 11, wherein the frequency mixer comprises a RF waveguide band and a RF probe configured to receive an input signal between 470 and 620 GHz.

14. The spectrometer of claim 11, wherein the frequency mixer is configured to multiply and down-convert the LO signal and RF signal to produce the IF signal ranging between 0 and 70 GHz.

15. The spectrometer of claim 11, wherein the frequency mixer is situated on a Quartz substrate providing a low dielectric constant, wherein the low dielectric constant is Er=4.

16. The spectrometer of claim 11, wherein the frequency mixer comprises an IF-LO impedance transition being applied to match an impedance of the LO filter to an RF probe, reducing reflection and power loss.

17. The spectrometer of claim 16, wherein the frequency mixer comprises a quarter-wave RF-LO impedance transition being used between the LO probe and the RF filter to impedance match and reduce losses and reflection of the LO signal propagating to the diode.

* * * * *